(12) United States Patent
Venkatraman et al.

(10) Patent No.: US 7,006,369 B2
(45) Date of Patent: Feb. 28, 2006

(54) DESIGN AND USE OF A SPACER CELL TO SUPPORT RECONFIGURABLE MEMORIES

(75) Inventors: Ramnath Venkatraman, San Jose, CA (US); Rugger Castagnetti, Menlo Park, CA (US); Subramanian Ramesh, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 128 days.

(21) Appl. No.: 10/650,192

(22) Filed: Aug. 27, 2003

(65) Prior Publication Data

US 2005/0047254 A1    Mar. 3, 2005

(51) Int. Cl.
  *G11C 5/06* (2006.01)
  *G11C 11/40* (2006.01)
(52) U.S. Cl. .................. 365/63; 365/154; 365/156; 365/189.04; 365/230.05; 257/903; 257/E27.099
(58) Field of Classification Search .............. 257/903, 257/E27.099; 365/154, 156, 230.05
See application file for complete search history.

(56) References Cited

U.S. PATENT DOCUMENTS

| | | | |
|---|---|---|---|
| 5,877,976 A * | 3/1999 | Lattimore et al. ............ 365/63 |
| 5,923,593 A * | 7/1999 | Hsu et al. .............. 365/189.04 |
| 6,236,618 B1 | 5/2001 | Roy | |
| 6,266,263 B1 | 7/2001 | Lien et al. | |
| 6,380,592 B1 | 4/2002 | Tooher et al. | |
| 6,552,951 B1 * | 4/2003 | Raj et al. ............... 365/230.05 |
| 6,594,196 B1 | 7/2003 | Hsu et al. | |

* cited by examiner

*Primary Examiner*—Son Mai
(74) *Attorney, Agent, or Firm*—Sawyer Law Group LLP

(57) ABSTRACT

The present invention provides a method and apparatus for reconfiguring a memory array. Aspects of the present invention include fabricating the memory array as at least one row of single-port cells up to a first metal layer. A split word line having first and second word lines is coupled to the single-port cells in each row, wherein the first word line is patterned in the first metal layer, and the second word line is patterned in a second metal layer. The split word line is further coupled to a spacer cell in the row. The method and apparatus further include programming the memory array into custom configurations based on whether the first and second word lines are connected over the spacer cell, or whether the first and second word lines are left unconnected.

26 Claims, 7 Drawing Sheets

600

DESIGN AND USE OF A SPACER CELL TO SUPPORT RECONFIGURABLE MEMORIES

CROSS-REFERENCE TO RELATED APPLICATION

This application is related to co-pending U.S. patent application Ser. No. 10/431,940, entitled "Metal Programmable Single-Port SRAM Array For Dual-Port Functionality," filed on May 8, 2003, by the assignee of the present invention and incorporated herein by reference.

FIELD OF THE INVENTION

The present invention relates to implementing single and dual port static random-access memories, and more particularly to a method and apparatus for reconfiguring a memory array into sub-arrays of single-port, dual-port, or both, using spacer cells.

BACKGROUND OF THE INVENTION

The assignee of the present application has introduced a family of ASICs that are based on a predefined fabric of logic cells and memories that form a configurable base (or "slice"). The silicon containing this "slice" is processed up to a predefined layer, such as metal 1, to be customized or configured later to provide the desired functionality as per customer specifications, using subsequent levels of vias and metals. This reduces non-recurring costs as well as turn-around time for chip designs. To provide the maximum flexibility as well as utilization of the "pre-diffused" circuitry, it is necessary to use designs that are easily configurable to provide the desired functionality using metal levels only.

Application Ser. No. 10/431,940, entitled "Metal Programmable Single-Port SRAM Array For Dual-Port Functionality," provides such a configurable design for providing dual-port capability to an SRAM array. The SRAM array is first fabricated with single port memory cells up to the metal 1 layer. Thereafter, the single port SRAM cells are configured using upper levels of metallization to provide customized multiport capability, as shown in FIG. 1.

FIG. 1 is a diagram illustrating an SRAM array comprising conventional single-port cells and split word lines. Each single-port cell 700 comprises six transistors that form a flip-flop circuit for storing data, which is formed by cross-coupling two logic inverters formed by transistors Q1D–Q4D, and two pass-gate transistors Q5D and Q6D. The source and drain of pass-gate transistor Q5D are connected between bit lines 720 and node 706D. The source and drain of pass-gate transistor Q6D are connected between inverse bit lines 728 and node 710D. Unlike a single word-line memory circuit, SRAM array 600 uses two word lines per row, word lines 724 and 730, each of which is connected to only one of the pass-gate transistors. Word line 724 is connected to the gate terminal of pass-gate transistor Q5D, and word line 730 is connected to the gate terminal of pass-gate transistor Q6D. In normal single port operation, data can be written to, or read from, each cell by asserting corresponding word and bit lines.

FIG. 1 also shows how two or more split word memory cells, such as cells 700 and 702 of the same row, can be connected in the array and metal-programmed to function as a dual-port memory cell. Internal node 706D of memory cell 700 is connected to internal node 706E of memory cell 702 via metal connection 704. Internal node 710D of memory cell 700 is connected to internal node 710E of memory cell 702 via metal connection 708. Connecting these corresponding internal nodes together forms a dual-port memory cell from the two single-port memory cells 700 and 702. The first port is made up of bit lines 720 and 722 and word line 724, which are connected to pass-gate transistors Q5D and Q6E. The second port is made up of bit lines 726 and 728 and word line 730, which are connected to pass-gate transistors Q6D and Q5E.

Using split word lines with metal programming as shown in FIG. 1 allows a dual-port memory cell to be assembled from only two single-port memory cells, which saves a significant amount of layout space compared to a situation where the base array is made of dual port cells. However, it would also be useful to have an additional degree of configurability wherein a given array of cells can be broken into multiple, smaller sub-arrays (or instances), each of which can be configured as single port (1P), dual port (2P), or multi-port in general. The "break points" in the array where the sub-arrays are separated must be configurable and flexible. In addition, the break points must be configurable in such a manner as to render an unused sub-array incapable of impacting the remaining (targeted) functional sub-arrays. The present invention addresses such needs.

SUMMARY OF THE INVENTION

The present invention provides a method and apparatus for reconfiguring a memory array. Aspects of the present invention include fabricating the memory array as at least one row of single-port cells up to a first metal layer. A split word line having first and second word lines is coupled to the single-port cells in each row, wherein the first word line is patterned in the first metal layer, and the second word line is patterned in a second metal layer. The split word line is further coupled to a spacer cell in the row. The method and apparatus further include programming the memory array into custom configurations based on whether the first and second word lines are connected over the spacer cell, or whether the first and second word lines are left unconnected.

According to the method and system disclosed herein, a memory array can be configured into sub-arrays of single-port, dual-port, or both, using metal programming and spacer cells. The present invention satisfies the following requirements: 1) single-port and/or multi-port capability in any given sub-array; 2) flexibility of break-point locations while satisfying the flexibility of single/multi-port capability; and 3) flexibility of "turning-off" supply voltage to unused sub-arrays.

DETAILED DESCRIPTION OF THE INVENTION

Figure 1:
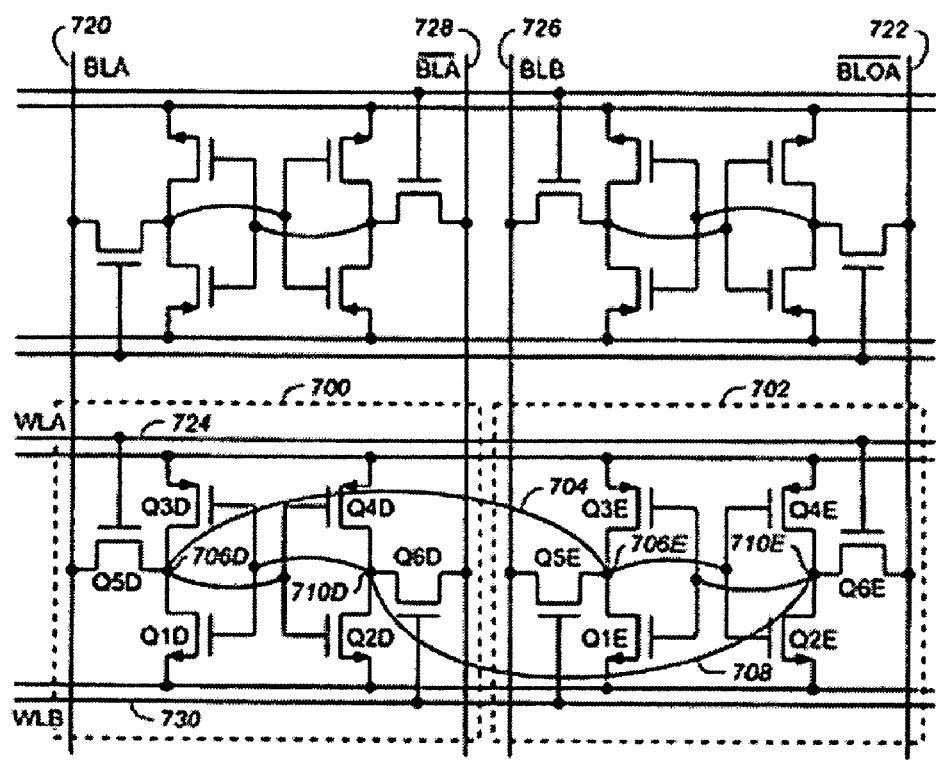
FIG. 1 is a diagram illustrating an SRAM array comprising conventional single-port cells and split word lines.

The present invention relates to reconfiguring a memory array using spacer cells. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

There are two basic types of semiconductor random-access memory (RAM) circuits in common use. Static random-access memory (SRAM) circuits store data by way of a feedback circuit. Dynamic random-access memory (DRAM) stores data as electrostatic charge on a capacitor. In general RAM circuits are configured as a two-dimensional array of individual memory cells, with each memory cell storing one bit. A word of data may be accessed from one or more memory circuits by addressing the cells that store the data by row and column addresses and reading or writing to or from the addressed cells. In a typical SRAM array, each memory word is stored in a separate row and addressed by asserting a "word line," while individual bits of each word are read from and written to the memory array using "bit lines." In a typical single-port memory array, all bit lines for a particular bit position are connected together. For example, all memory cells representing bit position 4 of a word typically share common bit lines, but have separate word lines. The generic term for word lines and bit lines is "address lines," has address lines are used for addressing individual memory cells.

Memory circuits may be single-port or multi-port memory circuits. Single-port circuits are capable of allowing access to a single memory location (i.e., one cell or a group of cells at a single memory address). Multi-port circuits allow two or more memory addresses to be accessed concurrently. Specifically, a "port" is a set of related address lines that together are sufficient to perform one memory access at a particular point in time. Thus, a single-port memory cell, which only has one port, is capable of supporting only one access at a time, while a dual-port memory cell, which has two ports, is capable supporting two simultaneous memory accesses. Higher-order multi-port cells (e.g., three-port, four-port, etc. . . . ), which support larger numbers of simultaneous accesses, are also possible.

The present invention provides a method and apparatus for reconfiguring such a memory array into sub-arrays of single-port, dual-port, or both, using spacer cells. In a preferred embodiment, the memory array is first fabricated as single-port cells up to metal 1. A split word line is then coupled to the cells in each row in the array, where the first word line is patterned in metal 1, and the second word line is patterned in metal 2 or higher. In standard memory array, spacer cells provide the function of providing well connections for Pwell and Nwell, as well as metal strapping for poly word lines. To achieve configurable memory designs in accordance with the present invention, the spacer cells are used not only to provide standard well connections, but also for serving as break points for the split word lines to configure the memory array into sub-arrays depending on the location of the spacer cell within the memory array.

Using the spacer cells as a break point for the split word line, the memory array can then be programmed into custom configurations depending on whether the separate word lines of the split word line are connected over the spacer cell (using the second metal layer or higher), or whether the word lines are left unconnected. Connecting the word lines of a split word line pair provides the cells to which the split word line is connected with the single port capability, while leaving the word lines unconnected provides the cells with dual-port capability. According to the present invention, the base memory array can be configured into any pattern of sub-arrays, which may be programmed as either single port, dual port, or multiport in general.

Figure 2:
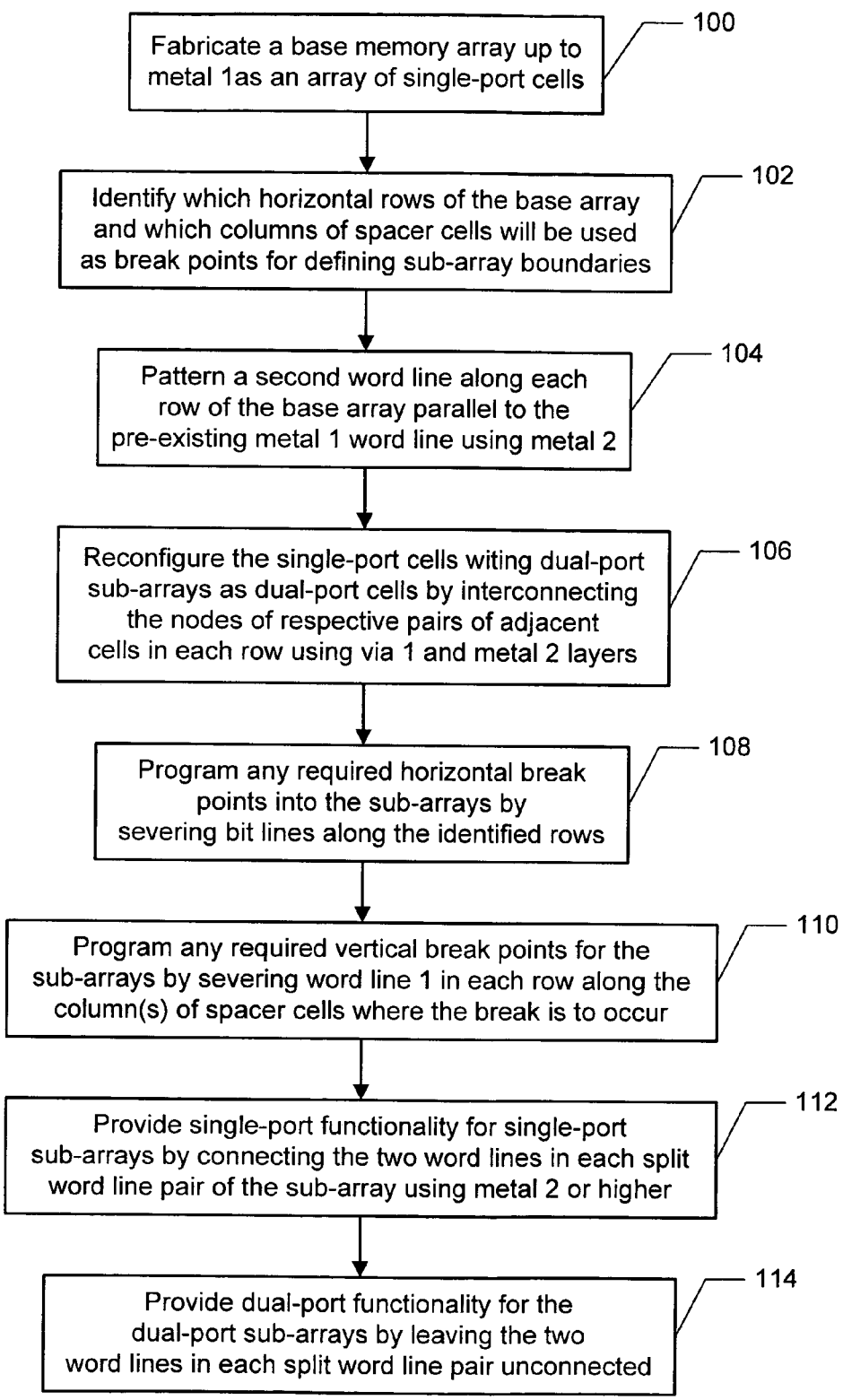
FIG. 2 is a flow diagram of the process of reconfiguring a memory array using spacer cells in accordance with a preferred embodiment of the present invention.

FIG. 2 is a flow diagram of the process of reconfiguring a memory array using spacer cells in accordance with a preferred embodiment of the present invention. The process begins in step 100 by fabricating a base memory array up to the metal 1 layer as an array of single-port cells. In a preferred embodiment, the base array is fabricated as an SRAM. The array is also fabricated with columns of spacer cells located at regular intervals, such as after every eight or sixteen cells in each row, and a metal 1 word line patterned across each row of cells. In a preferred embodiment, many base memory arrays are fabricated as "off-the-shelf" base arrays and are used for subsequent creation of custom memory designs.

In step 102, a custom memory can be designed by reconfiguring one of the base arrays into one more sub-arrays by identifying which horizontal rows of the base array and which columns of spacer cells will be used as break points for defining sub-array boundaries.

Figure 3:
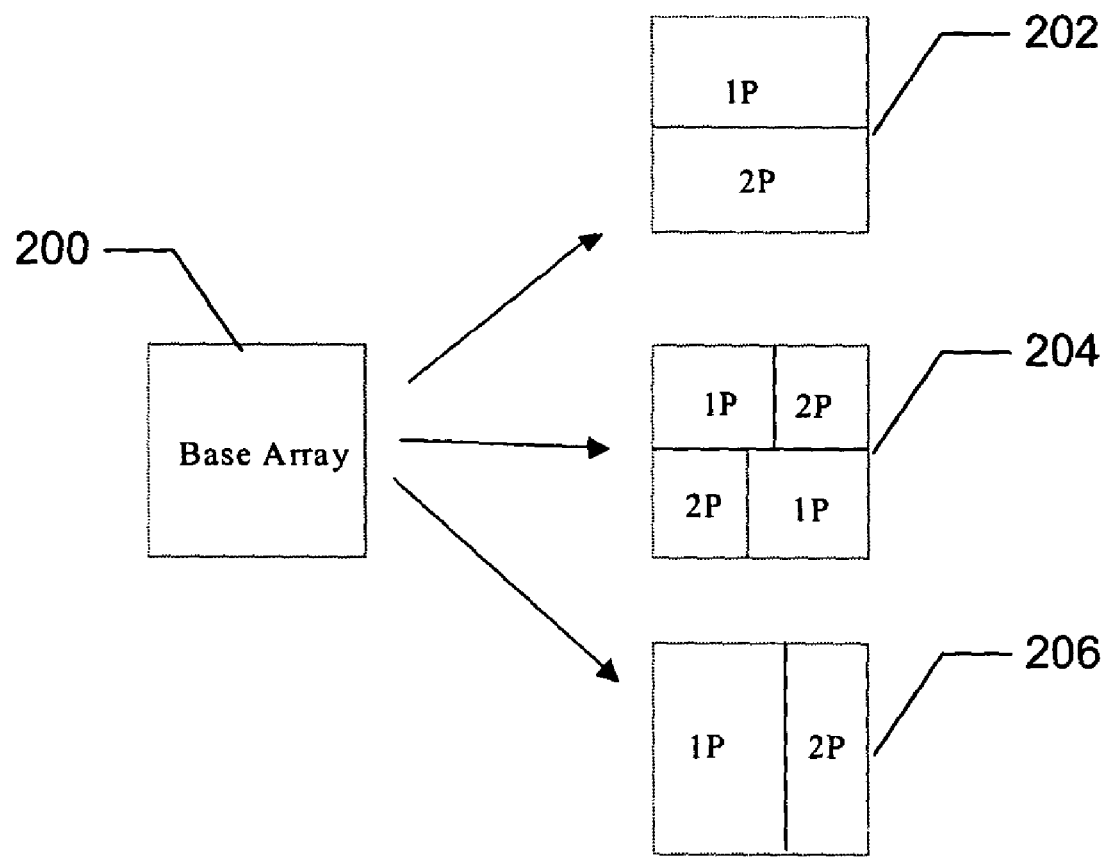
FIG. 3 is a block diagram illustrating a base memory array broken into three example sub-array configurations.

FIG. 3 is a block diagram illustrating a base memory array 200 and three example sub-array configurations created from the memory array 200. The first example 202 illustrates the base array configured as two top and bottom sub-arrays, where the top sub-array is single-port (1P), and the bottom sub-array is dual-port (2P). The second example 204 illustrates the base array 200 configured as a grid of four sub-arrays: two single-port sub-arrays (1P), and two multi-port sub-arrays (2P). The third example 206 illustrates the base array 200 configured as to side-by-side sub-arrays, one single-port (1P), and one dual-port (2P).

Referring again to FIG. 2, in step 104 a second word line is patterned along each row of the base array parallel to the pre-existing metal 1 word line using metal 2 (or higher) to provide each row of the base array with a split word line pair.

Figure 4:
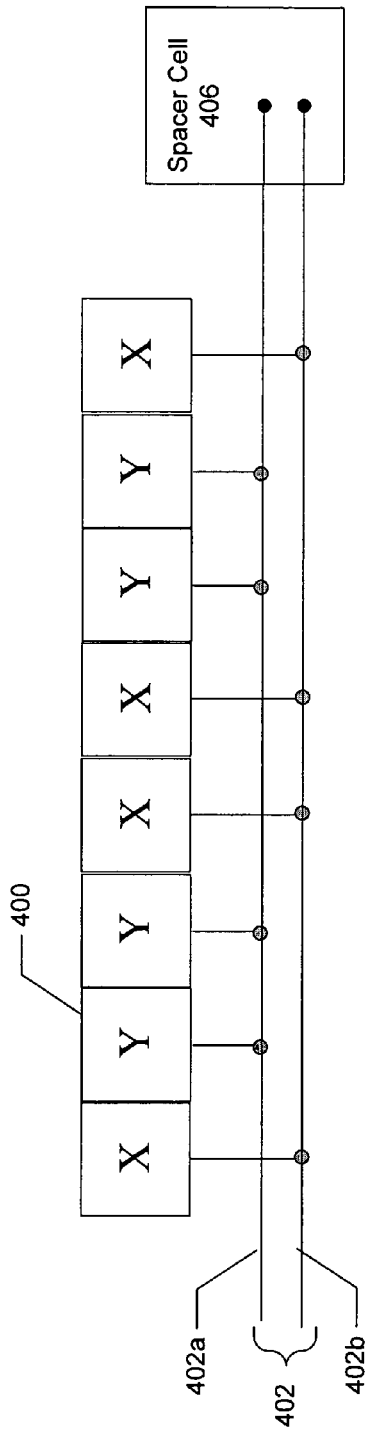
FIG. 4 is a diagram illustrating the basic layout of a row of cells after the second word line has been patterned.

FIG. 4 is a diagram illustrating the basic layout of a row of cells after the second word line has been patterned. The row of single-port cells 400 are shown in a sequence of XYYXXYYX, rather than XYXYXYXY, and are coupled to a split word line 402 comprising word line A 402a and word line B 402b. Word line A and word line B are patterned on different metal levels, typically metal 1 and metal 2. The Y cells are shown coupled to word line A and the X cells are shown are coupled to word line B. As described below, the split word line 402 line may either terminate at a configurable spacer cell 406 or extend past the configurable spacer cell 406 with or without a break, depending on the desired memory configuration.

Referring again to FIG. 2, in step 106, for any areas of the array that are to be configured as a dual-port sub-array, the single-port cells 400 are reconfigured as dual-port cells by interconnecting the nodes of respective pairs of adjacent cells in each row using via 1 and metal 2 layers.

Figure 5:
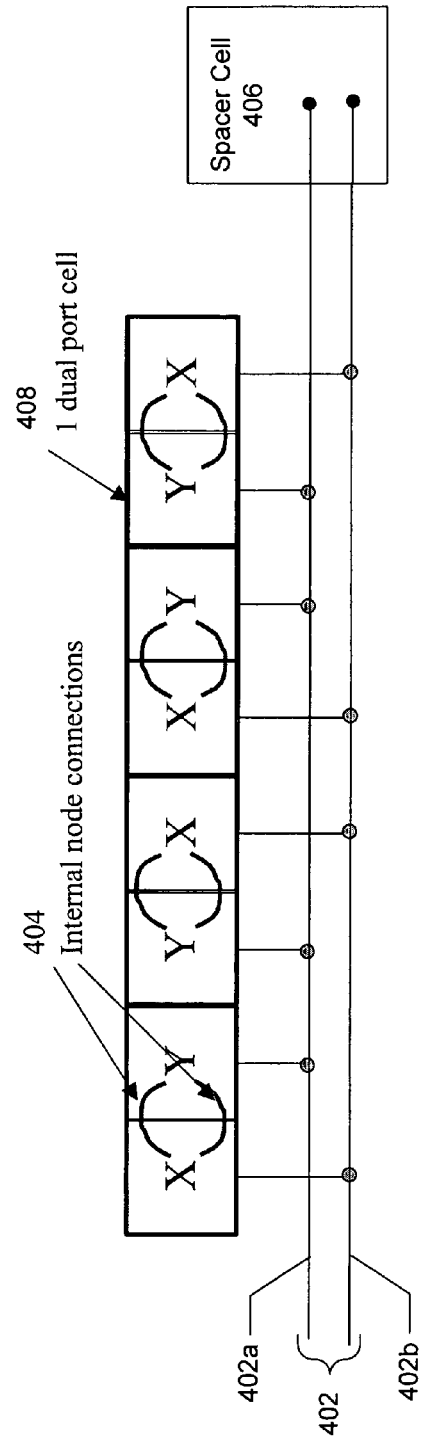
FIG. 5 is a diagram illustrating the basic layout of a row of cells after the single-port cells are reconfigured as dual-port cells.

FIG. 5 is a diagram illustrating a basic layout of a row of cells after the single-port cells 400 are reconfigured as dual-port cells 408. Cell pairs X and Y are combined to form individual dual-port cells 408. Internal nodes within adjacent X and Y cell pairs are shown connected with internal node connections 404, preferably via 1 and metal 2. Word line A and word line B are shown unconnected over the spacer cell 406. Although not shown, bit lines, supply voltage VSS and VDD lines are also patterned in the array using via 1, metal 2, via 2 and metal 3. Bit lines are preferably metal 3 in this case.

Referring again to FIG. 2, in step 108, any required horizontal break points are programmed in the base array by severing the bit lines along the identified rows. In step 110, any required vertical break points for the sub-arrays are programmed into the array. The metal 1 word line in each row is fixed and is already severed within every spacer cell. Therefore, the severed word lines in the column(s) of spacer cells 406 that are to occupy a common sub-array are connected to remove default break-points.

Thereafter, the sub-arrays defined by the horizontal and vertical break points are provided with single or dual port functionality based on how the two word lines in each row are connected over the spacer cells 406, thereby serving as configurable connection points for each row of split word lines. Single-port functionality is provided for single-port sub-arrays in step 112 by using via 1 and metal 2 or higher to connect the two word lines in each split word line pair to each other within the spacer cells 406 defining the single-port sub-array break points. Dual-port functionality is provided for dual-port sub-arrays in step 114 by leaving the two word lines in each split word line pair unconnected within the spacer cells defining the dual-port sub-array break points.

As those with ordinary skill in the art will readily appreciate, the process described with respect to FIG. 2 for reconfiguring a base memory array after metal 1 can be performed in an order different from the order described.

Referring now to FIGS. 6A–6E, example configurations are shown for various split word line connections made over the configurable spacer cell of the present invention. In each example, the metal 1 word line is severed over the spacer cell 406.

Figure 6A:
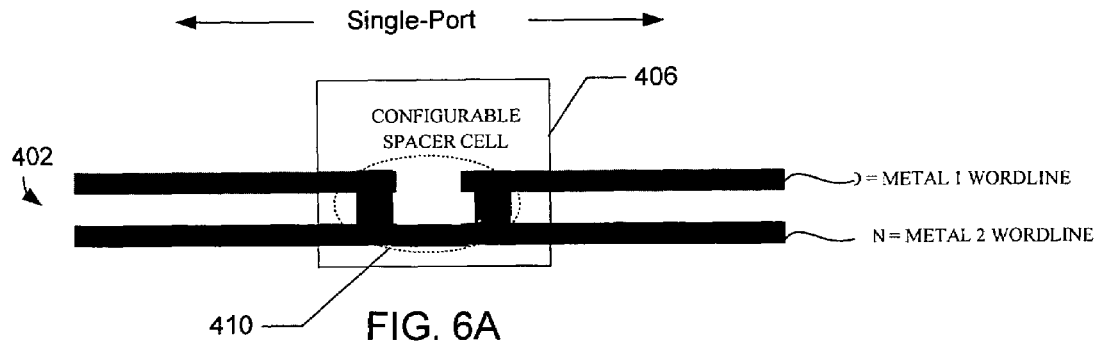
FIG. 6A illustrates a single-port, no break configuration.

FIG. 6A illustrates a single-port, no break configuration 410. In this configuration 410, the metal 1 word line is coupled to the metal 2 word line using a via 1 and metal 2 connection 410, and the metal 2 word line extends across the spacer cell 406. When the spacer cell 406 is not used as a break point, the split word line 402 is part of the same sub-array.

Figure 6B:
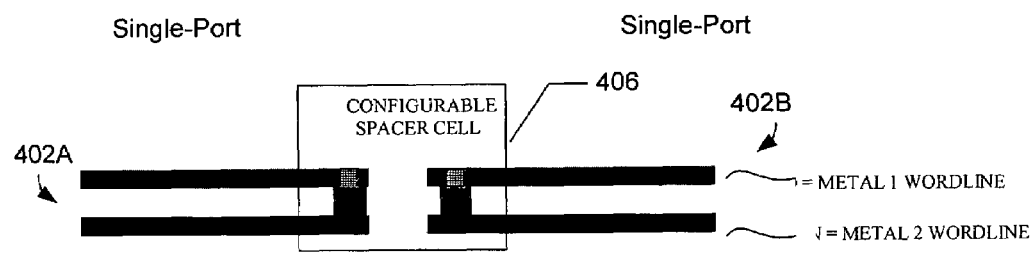
FIG. 6B illustrates a configuration comprising a break with single-port on either side.

FIG. 6B illustrates a configuration comprising a break with single-port on either side. In this configuration, the spacer cell 406 is used as a breakpoint that severs the split word line to form two split word lines 402a and 402b and therefore two sub-arrays on each side of the spacer cell 406. The metal 1 and metal 2 word lines in the respective split line pairs 402a and 402b are connected using via 1 and metal 2, thus creating single-port sub-arrays on both sides of the spacer cell 406.

Figure 6C:
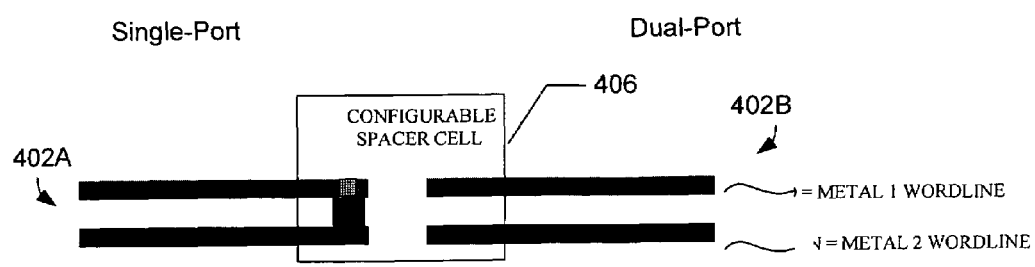
FIG. 6C illustrates a configuration comprising a break with single port on one side and dual port on the other side.

FIG. 6C illustrates a configuration comprising a break with single port on one side and dual port on the other side. As in FIG. 6B, the spacer cell 406 is used as a breakpoint that severs the split word line to form two split word lines 402a and 402b and therefore two sub-arrays on each side of the spacer cell 406. However, the metal 1 and metal 2 word lines of split line pair 402a are connected using via 1 and metal 2, thus creating single-port sub-array on that side of the spacer cell 406. Conversely, the metal 1 and metal 2 word lines of split word line pair 402b are left unconnected, creating a dual-port sub-array on the other side of the spacer cell 406.

Figure 6D:
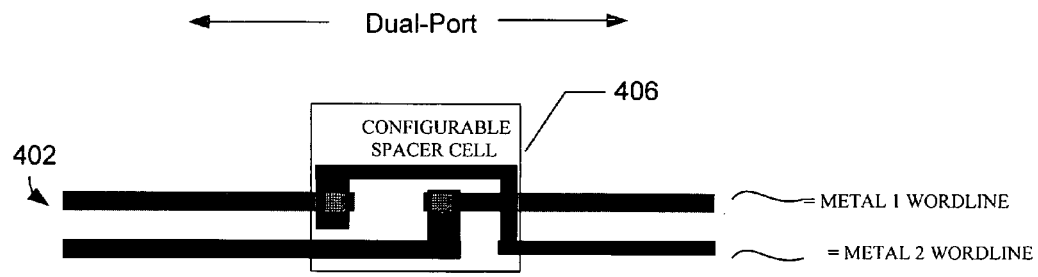
FIG. 6D illustrates a dual-port, no break configuration.

FIG. 6D illustrates a dual-port, no break configuration in which the split word line 402 extends across the spacer cell 406 and the metal 1 and metal 2 word lines are coupled using separate via 1 and metal 2 connections 412a and 412b, providing dual-port functionality. As the spacer cell 406 is not used as a breakpoint, the split word line 402 is used within the same dual-port sub-array.

Figure 6E:
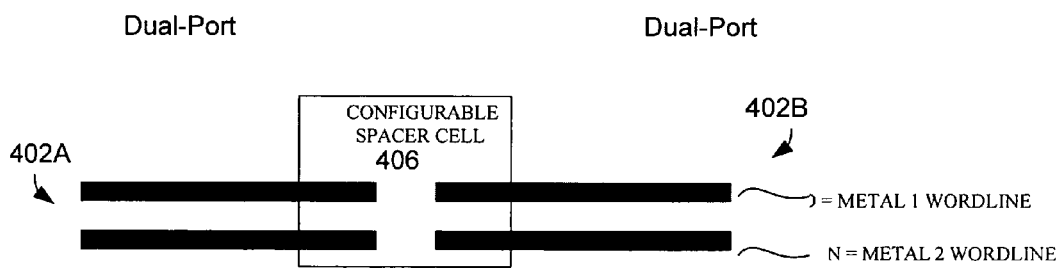
FIG. 6E illustrates a configuration comprising a break with dual-port on either side.

FIG. 6E illustrates a configuration comprising a break with dual-port on either side. In this configuration, the spacer cell 406 is used as a breakpoint that severs the split word line to form two split word lines 402a and 402b and therefore two sub-arrays on each side of the spacer cell 406. The metal 1 and metal 2 word lines in the respective split word line pairs 402a and 402b are left unconnected, thus creating dual-port sub-arrays on both sides of the spacer cell 406.

According to the present invention, in each of the examples, the spacer cells 406 in the base memory array remain the same up to metal 1, and the different configurations below are achieved using via 1 and subsequent masking levels only (typically via 1 and metal 2). Also in the examples below, the internal nodes of the individual SRAM cells are either tied as shown in FIGS. 1 and 5, or not tied, depending on whether the sub-array is targeted to the functional as a dual-port or a single-port, respectively.

In addition to the example configurations above, an interesting case of two independent single port memories can be achieved using the spacer cell configuration shown in FIG. 6D. If a given array (or sub-array) is configured as single port (internal nodes of adjacent cells not tied) and the spacer cells 406 within the array (or sub-array) are configured as in FIG. 6D, then two separate single-port memories within the same array (or sub-array) may be created that are "woven" into each other. This enables the possibility of providing even more flexibility and an additional number of sub-arrays into which a given base array may be configured into.

Lastly, each spacer cell 406 also contains a supply voltage (VDD) connection that ties to a horizontal VDD metal 1 line extending across a row in the array or sub-array. An area of concern in the case where a base array is broken into sub-arrays is that the supply voltage is typically shared by the entire array. If some of the sub-arrays are chosen not to be used (or be "paved over") in the final configured design, then it is possible that a random process defect in an unused sub-array may short the supply voltage to an unrelated electrical node and adversely affect the functionality of the useful sub-arrays.

A further embodiment of the present invention avoids this by making the "break points" configurable in such a manner as to render the unused sub-arrays incapable of impacting the remaining (targeted) functional sub-arrays.

Figure 7A:
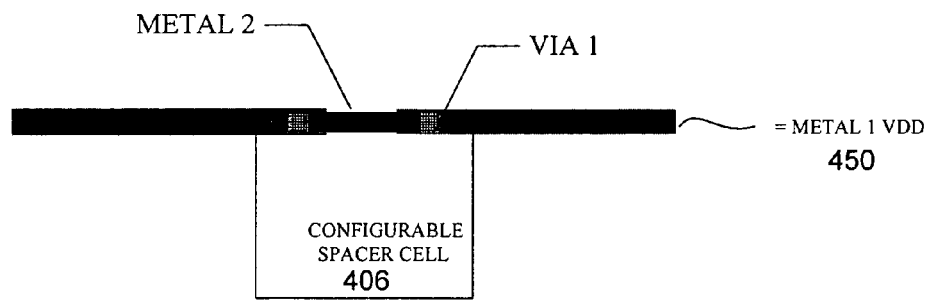
FIGS. 7A and 7B illustrate two example configurations for a VDD connection within a spacer cell according to a further aspect of the present invention.
Figure 7B:
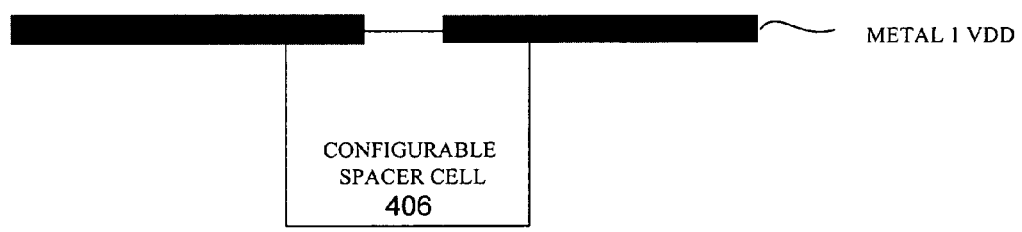

FIGS. 7A and 7B illustrate two example configurations for this VDD connection within the spacer cell 406 according with this further aspect of the present invention.

FIG. 7A illustrates a normal "no break" configuration in which the metal 1 VDD line 450 within the spacer cell 406 is connected with metal 2 and is therefore not broken. Thus, power is supplied to cells on both sides of the spacer cell

406. FIG. 7B illustrates a break configuration in which the metal 1 VDD line within the spacer cell 406 is severed. As mentioned above, this enables the VDD connection to be turned-off to an unused portion of the base memory array, thereby preventing the unused portion of the array to affect the operating portions of the array.

A method and apparatus has been disclosed for reconfiguring a memory array into sub-arrays of single-port, dual-port, or both, using metal programming and spacer cells. The present invention satisfies the following requirements: 1) single-port and/or multi-port capability in any given sub-array; 2) flexibility of break-point locations while satisfying the flexibility of single/multi-port capability and; 3) flexibility of "turning-off" supply voltage to unused sub-arrays.

The present invention has been described in terms of a preferred embodiment in which all layers up to metal 1 are fixed. However, according to a further aspect of the present invention, the metal 1 may be also deemed "configurable," such that the base memory array is provided as rows of cells prior to adding the first metal layer. Note, that the advantage of having pre-patterned wafers before metal 1 is that metal 1 can now be used as a configurable layer. This will specifically make the case in FIG. 6D (dual port, no break) much easier to implement. In this case, metal 1 from either end can be patterned continuously across the spacer cells, or simply joined (same for metal 2) without the need for vias.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for reconfiguring a memory array, comprising:
    (a) providing the memory array as at least one row of single-port cells up to a first metal layer;
    (b) coupling a split word line having first and second word lines to the single-port cells in each row, wherein the first word line is patterned in the first metal layer, and the second word line is patterned in a second metal layer;
    (c) coupling the split word line to a spacer cell in the row; and
    (d) programming the memory array into custom configurations based on whether the first and second word lines are connected over the spacer cell, or whether the first and second word lines are left unconnected.

2. The method of claim 1 wherein step (d) further includes the step of:
    providing a single-port configuration by connecting the first and second word lines over the spacer cell using the second metal layer or higher.

3. The method of claim 2 wherein step (d) further includes the step of:
    providing a dual-port configuration by,
        (i) interconnecting internal nodes of respective pairs of adjacent single-port cells in the row using the second metal layer to reconfigure the single-port cells into dual-port cells, and
        (ii) leaving the first and second word lines unconnected over the spacer cell.

4. The method of claim 1 wherein step (d) further includes step of: providing a single-port, no break configuration in which the first word line is coupled to the second word line using a via 1 and metal 2 connection, and wherein the second word line extends across the spacer cell.

5. The method of claim 1 wherein step (d) further includes step of: providing a configuration comprising a break with single-port on either side in which the split word line is severed over the spacer cell to form two split word lines and therefore two sub-arrays on each side of the spacer cell, and wherein the first and second word lines in the respective split word lines are connected using via 1 and metal 2, thereby creating single-port sub-arrays on both sides of the spacer cell.

6. The method of claim 1 wherein step (d) further includes step of: providing a configuration comprising a break with single port on one side and dual port on the other side in which the split word line is severed over the spacer cell to form two split word lines and therefore two sub-arrays on each side of the spacer cell, and wherein the first and second word lines of one of the split word lines are connected using via 1 and metal 2, creating single-port sub-array on a first side of the spacer cell, while the first and second word lines of the other split word line are left unconnected, creating a dual-port sub-array a second side of the spacer cell.

7. The method of claim 1 wherein step (d) further includes step of: providing a dual-port, no break configuration in which the split word line extends across the spacer cell and the first and second word lines are coupled using separate via 1 and metal 2 connections, providing dual-port functionality.

8. The method of claim 1 further including the step of: providing a configuration in which two single-port sub-arrays are woven together coupling the first and second word lines of the split word line extending across the spacer cell between the two sub-arrays using via 1 and metal 2 connections.

9. The method of claim 1 wherein step (d) further includes step of: providing a configuration comprising a break with dual-port on either side the split word line is severed over the spacer cell to form two split word lines and therefore two sub-arrays on each side of the spacer cell, and wherein the first and second word lines in the respective split word line are left unconnected, creating dual-port sub-arrays on both sides of the spacer cell.

10. The method of claim 1 wherein step (d) further includes steps of: providing a no break supply voltage configuration in which a metal VDD line within the spacer cell is not broken, thereby supplying power cells on both sides of the spacer cell.

11. The method of claim 10 wherein step (d) further includes steps of:
    providing a break supply voltage configuration in which the VDD line within the spacer cell is severed, such that the VDD connection is turned-off to an unused portion of the base memory array, thereby preventing unused portion of the array to affect the operating portions of the array.

12. A configurable memory array, comprising:
    an array of single-port cells fabricated up to a first metal layer;
    a split word line having first and second word lines patterned across a plurality of rows in the array and coupled to each of the single-port cells in the row, wherein the first word line is patterned in the first metal layer, and the second word line is patterned in a second metal layer; and
    columns of spacer cells fabricated in the array, wherein the split word lines of each of the plurality of rows are coupled to the corresponding spacer cell in that row;

wherein the memory array can be programmed using the second layer of metal into custom configurations based on whether the first and second word lines of the split word lines are connected over the spacer cell, or whether the first and second word lines are left unconnected.

13. The memory array of claim 12 wherein the columns of spacer cells can be used as break points to define sub-arrays by severing the split word lines across a particular column of spacer cells.

14. The memory array of claim 12 wherein a single-port configuration can be provided by connecting the first and second word lines over the spacer cells using the second metal layer or higher.

15. The memory array of claim 14 wherein a dual-port configuration can be provided by,
   (i) interconnecting internal nodes of respective pairs of adjacent single-port cells in each row using the second metal layer to reconfigure the single-port cells into dual-port cells, and
   (ii) leaving the first and second word lines unconnected over the spacer cells.

16. The memory array of claim 12 wherein a single-port, no break configuration is provided in which the first word line is coupled to the second word line using a via 1 and metal 2 connection, and wherein the second word line extends across the spacer cells.

17. The memory array of claim 12 wherein a configuration comprising a break with single-port on either side is provided in which the split word lines are severed over the spacer cells to form two split word lines and therefore two sub-arrays on each side of the spacer cells, and wherein the first and second word lines in the respective split word lines are connected using via 1 and metal 2, thus creating single-port sub-arrays on both sides of the spacer cells.

18. The memory array of claim 12 wherein a configuration comprising a break with single port on one side and dual port on the other side is provided in which the split word lines are severed over the spacer cells to form two split word lines and therefore two sub-arrays on each side of the spacer cells, and wherein the first and second word lines of the split word lines are connected using via 1 and metal 2, creating single-port sub-array on a first side of the spacer cells, while the first and second word lines of the other split word lines are left unconnected, creating a dual-port sub-array on a second side of the spacer cells.

19. The memory array of claim 12 wherein a dual-port, no break configuration is provided in which the split word lines extend across the spacer cells and the first and second word lines are coupled using separate via 1 and metal 2 connections, providing dual-port functionality.

20. The memory array of claim 12 wherein a configuration comprising a break with dual-port on either side is provided in which the split word lines are severed over the spacer cells to form two split word lines and therefore two sub-arrays on each side of the spacer cells, and wherein the first and second word lines in the respective split word line are left unconnected, creating dual-port sub-arrays on both sides of the spacer cells.

21. The memory array of claim 12 wherein a no break supply voltage configuration is provided in which a metal VDD line extending across each row of the array and across the spacer cells are not broken, thereby supplying power cells on both sides of the spacer cells.

22. The memory array of claim 21 wherein a break supply voltage configuration is provided in which the VDD line across the spacer cells are severed, such that the VDD connection is turned-off to an unused portion of the base memory array, thereby preventing the unused portion of the array to affect operating portions of the array.

23. A method for reconfiguring a base memory array, comprising:
   (a) fabricating the base memory array up to the metal 1 layer as an array of single-port cells, wherein the base memory includes a first word line in each row coupled to the single-port cells in that row;
   (b) identifying which horizontal rows of the base memory array and which columns of spacer cells will be used as break points for defining sub-array boundaries;
   (c) patterning a second word line along each row of the base memory array parallel to the pre-existing metal 1 word line using metal 2 to provide each row of the base memory array with a split word line pair;
   (d) for any areas of the base memory array to be configured as a dual-port sub-array, reconfiguring the single-port cells as dual-port cells by interconnecting internal nodes of respective pairs of adjacent cells in each row using via 1 and metal 2 layers;
   (e) programming any required horizontal break points into the base memory array by severing bit lines along the identified rows;
   (f) providing single-port functionality for single-port sub-arrays by using via 1 and metal 2 or higher to connect the two word lines in each split word line pair of the sub-array over within the spacer cells defining the single-port sub-array break points; and
   (g) providing dual-port functionality for dual-port sub-arrays by leaving the two word lines in each split word line pair unconnected within the spacer cells defining the dual-port sub-array break points.

24. A method for reconfiguring a memory array, comprising:
   (a) providing the memory array as at least one row of single-port cells prior to adding a first metal layer;
   (b) coupling a split word line having first and second word lines to the single-port cells in each row, wherein the first word line is patterned in the first metal layer, and the second word line is patterned in a second metal layer;
   (c) coupling the split word line to a spacer cell in the row; and
   (d) programming the memory array into custom configurations based on whether the first and second word lines are connected over the spacer cell, or whether the first and second word lines are left unconnected, wherein the first metal layer is configurable, such that the first metal layer can be patterned continuously across the spacer cell.

25. The method of claim 24 wherein step (d) further includes the step of:
   providing a single-port configuration by connecting the first and second word lines over the spacer cell using the second metal layer or higher.

26. The method of claim 25 wherein step (d) further includes the step of:
   providing a dual-port configuration by,
      (i) interconnecting internal nodes of respective pairs of adjacent single-port cells in the row using the second metal layer to reconfigure the single-port cells into dual-port cells, and
      (ii) leaving the first and second word lines unconnected over the spacer cell.

* * * * *